United States Patent [19]

Forstner et al.

[11] 4,295,441

[45] Oct. 20, 1981

[54] APPARATUS FOR APPLYING SOLDER TO THE CONNECTIONS OF INTEGRATED CIRCUIT COMPONENTS

[75] Inventors: Anton Forstner; Kurt Schatzmann, both of Dietikon, Switzerland

[73] Assignee: Siemens-Albis Aktiengesellschaft, Zürich, Switzerland

[21] Appl. No.: 209,665

[22] Filed: Nov. 24, 1980

[30] Foreign Application Priority Data

Jan. 30, 1980 [CH] Switzerland .................. 738/80

[51] Int. Cl.$^3$ .................................................. B05C 3/09
[52] U.S. Cl. ............................... 118/425; 118/426; 228/38; 228/40
[58] Field of Search ............... 118/425, 426, 416, 421; 228/36, 37, 38, 40, 43; 427/96, 123

[56] References Cited

U.S. PATENT DOCUMENTS

| | | | |
|---|---|---|---|
| 3,056,371 | 10/1962 | Frank | 118/423 |
| 3,384,048 | 5/1968 | Kutcher | 118/426 |
| 3,498,258 | 3/1970 | Swaisgood | 118/426 |
| 3,765,591 | 10/1973 | Cook | 118/426 |
| 3,828,419 | 8/1974 | Wanney | 228/40 |

FOREIGN PATENT DOCUMENTS 51-2652  1/1976  Japan ................................ 228/38

*Primary Examiner*—Ralph S. Kendall
*Attorney, Agent, or Firm*—Werner W. Kleeman

[57] ABSTRACT

To improve the solderability of the terminals or connections of integrated circuit components (IC-components) with parallel connection rows these must be pre-tin plated. An apparatus is disclosed which immerses the connections or terminals to be pre-tin plated as deeply as possible into the solder bath without exposing the components to impermissible thermal loads. This is obtained in that the components which are to be initially or pre-tin plated are tilted about an axis extending parallel to the terminal or connection row in a manner such that the connections of a row are simultaneously immersed into the solder bath.

6 Claims, 3 Drawing Figures

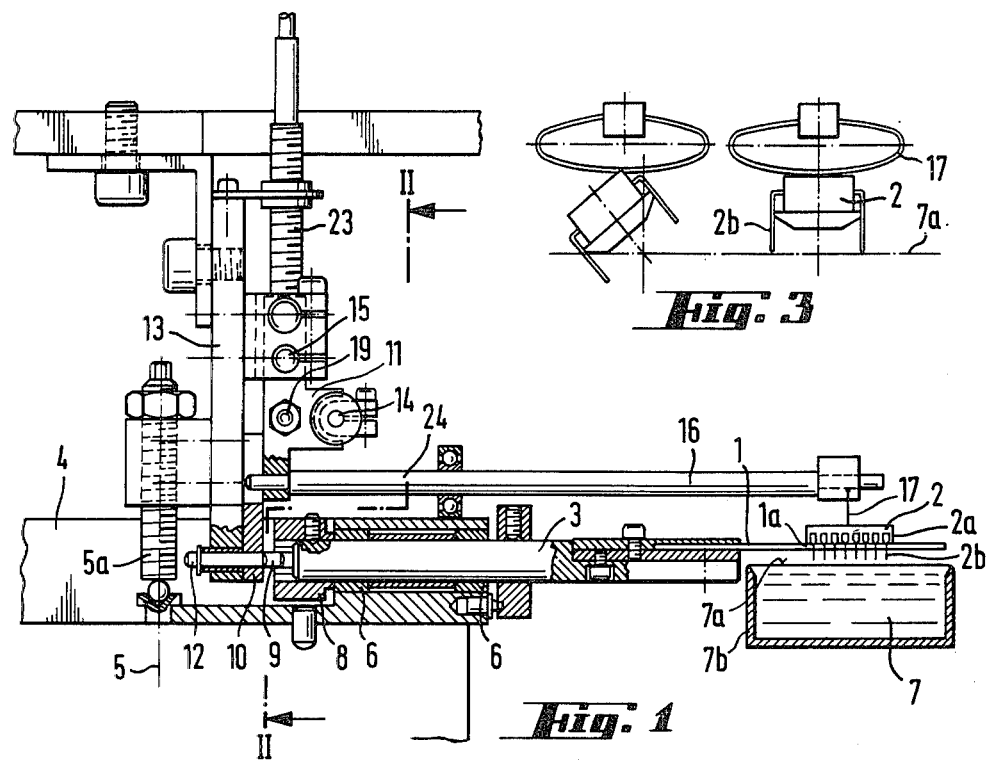
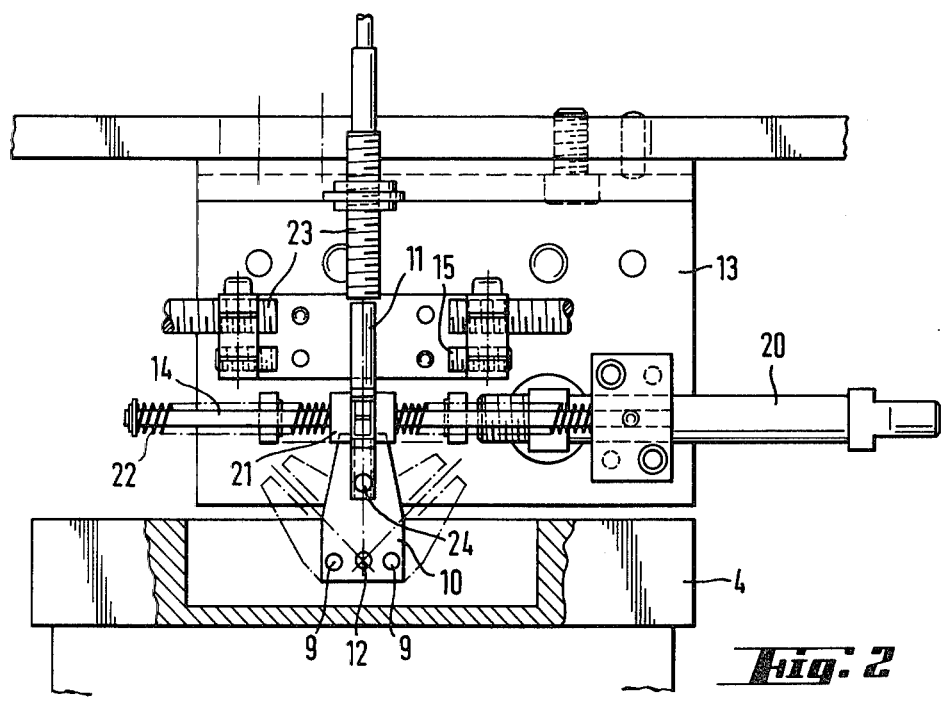

APPARATUS FOR APPLYING SOLDER TO THE CONNECTIONS OF INTEGRATED CIRCUIT COMPONENTS

BACKGROUND OF THE INVENTION

The present invention relates to a new and improved construction of apparatus for applying solder to the connections of integrated circuit components, and more specifically serves to apply solder located in a solder bath to the connections or terminals of integrated circuit components in a dual-in-line housing (DIL-housing).

Integrated circuit components in a DIL-housing, i.e. component units constructed in integrated circuit technology, are used increasingly in electronic installations since they exhibit a great packing density of the components, and thus, there is possible a low volume and low weight. Another advantage is the drastic reduction in the number of solder connections when forming extensive assemblies, which, not least of all, beneficially affects the mean faultless operating time of an installation in a favourable manner. However, increasingly greater requirements are placed upon the solder locations. Frequently the connections of commercially available IC-components do not satisfy these requirements as concerns their solderability, and therefore it is frequently necessary, following the solder operation, to undertake complicated testing and post-soldering work in order to ensure for a faultless quality of the solder locations, and thus, the disturbance free functionality of the equipment which is composed of such components.

These drawbacks can be countered in that prior to the actual soldering operation performed at the component groups or assemblies the terminals or connections of the IC-components are pre-tin plated, i.e. initially tin plated. In so doing there however exists the problem of completely and uniformly imbuing with solder each connection or terminal, in particular tin plating the connection up to a location close to its bending location or point. With vertical immersion of the connections in a solder bath their maximum immersion depth however is essentially governed by the spacing of the base or bottom surface of the component from the free ends of the connections. Furthermore, there must be taken into account that in the immersed condition there must be maintained a safety distance or spacing between the component and the upper surface of the solder bath, in order to protect the component against impermissible heating, which in turn, limits the maximum immersion depth of the connections.

SUMMARY OF THE INVENTION

Therefore, with the foregoing in mind it is a primary object of the present invention to provide a new and improved construction of apparatus for applying solder to the connections of integrated circuit components in the manner not associated with the aforementioned drawbacks and limitations of the prior art proposals.

Another important object of the present invention aims at providing a rational pre-tin plating of the connections of different types of IC-components in a dual-in-line (DIL) housing with as great as possible immersion depth of the connections into the solder bath.

Now in order to implement these and still further objects of the invention, which will become more readily apparent as the description proceeds, the apparatus of the present development is manifested by the features that there is provided at least one support or carrier for receiving at least one component, the support or carrier being displaceable relative to the solder bath such that the component can be brought into a position in which its connections are located at a certain spacing from the surface of the solder bath. The carrier or support, in this position, can be tilted about an axis extending essentially parallel to the connections of the supported component in a manner such that it can be placed in a position which is inclined with respect to the surface of the solder bath. Following the tilting movement to the one or other side the connections of a row of connections of the component are simultaneously immersed into the solder bath.

The inventive apparatus affords the advantage that there is possible a tin plating of the connections to a location extremely close to the bottom surface or face of the component, without subjecting the component to any excessive thermal load emanating from the solder bath.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 1 is a sectional view of an apparatus constructed according to the invention;

FIG. 2 is a sectional view of the arrangement of FIG. 1, taken substantially along the section line II—II thereof; and FIG. 3 illustrates details of the pivotal movement of the carrier or support of the apparatus for receiving the components which are to be tin plated.

DETAILED DESCRIPTION OF THE PREFERRED EMBODIMENTS

Describing now the drawings, in FIGS. 1 and 2 there have been illustrated the essential components of an exemplary embodiment of the apparatus constructed according to the invention while FIG. 2 constitutes a sectional view along the section line II—II of FIG. 1. Mounted upon a support or carrier 1 is a component 2 in a known dual-in-line housing 2a. Departing out of the plastic housing 2a encapsulating an integrated circuit from both sides of such housing are a number of usually equidistant connections or terminals 2b which should be pre-tin plated in order to improve the solderability. The support or carrier 1 is attached to a tiltable arm 3 which, in turn, is mounted at a rotatable table 4. The at least partially cylindrical tilting or tiltable arm 3 is rotatably mounted in sliding bushings or sleeves 6 of the rotatable table 4. A number of tiltable arms 3 having a carrier or support 1 could be provided at the rotatable table 4, which during rotation of such rotatable table 4 through a certain angle can be brought into a position shown lying in a plane perpendicular to the plane of the drawing of FIG. 1. In this position the component 2 reposing upon the support or carrier 1 is located over the surface 7a of a solder bath 7 contained within a container or vat 7b. The solder bath 7 can be raised and lowered in the direction of the support or carrier 1 by any suitable and therefore not particularly shown elevating or displacement means.

The rotatable table 4 is rotatably arranged about an axis 5 defined by a shaft 5a with respect to a carrier or support plate 13. At the end of the tiltable or pivotable arm 3 confronting the axis 5 there is mounted a coupling sleeve 8 or equivalent structure. In the illustrated position of the tiltable arm 3 two entrainment pins 9 or equivalent entrainment elements engage into such coupling sleeve 8. The entrainment pins 9 are embedded in a pivotal fork or bifurcated member 10 which is connected by means of a rotatable shaft 12 rotatably with the support or carrier plate 13. Furthermore, the pivotal fork member 10 is movably connected with an entrainment member 11, so that during linear movement of the entrainment member 11 essentially parallel to the support or carrier plate 13 the pivotal fork 10 can be deflected about the pivot shaft 12. This is realized by a pin 24 or equivalent structure connected with the entrainment member 11. The pin 24 engages into a recess or slot 10a of the pivotal fork member 10 and is guided therein. The moved entrainment member 11 is guided along a rod-shaped rail or guide 14 extending parallel to the support or carrier plate 13. Additionally, the entrainment member 11 is fixedly connected with a piston rod 19 of a double-acting cylinder 20 which, in known manner, can be pneumatically activated for instance. Upon actuation of the piston-and cylinder unit 20 the entrainment member 11 is displaced along the rail 14 in the one or the other direction, either to the left or the right of FIG. 2, out of the illustrated intermediate position. A spring 22 incorporated between the rail end and a related pressure ring 21 ensures that the entrainment member 11 again will be returned back into its starting position as soon as the action of the cylinder 20 has been eliminated. In FIG. 2 there are shown in phantom or broken lines two end positions of the pressure rings 21 and the corresponding positions of the entrainment member 11 after actuation of the cylinder 20. By means of inductive feeler elements 23 there is determined with the aid of a suitable control device the momentary position of the entrainment member 11. The path through which the entrainment member 11 is displaced during such motion is selectively limited in both directions by means of the adjustment elements 15, and thus, there is determined the deflection angle of the pivotal fork member 10.

Furthermore, at the entrainment member 11 there is mounted a holder 16 which extends over the tiltable or pivotable arm 3, this holder 16 following the motion of the entrainment member 11 and at the free end thereof there is attached a resilient wire bracket 17 which presses upon the component 2 located therebelow and fixedly retains such at the support or carrier 1 during the pivotal movement of the tiltable or pivotal arm 3. In contrast to the illustrated exemplary embodiment it is also possible to mount the holder 16 at the pivotal fork member 10 or, however, to provide instead of the holder 16 at each support or carrier 1 a clamping device which fixedly retains the component 2 which, in each case, after the charging of the component 2 is closed and prior to discharging or emptying again opened. The support or carrier 1 itself is substantially plate-shaped and consists of a thermally insulating, electrically non-conductive material. The cross-section of the support or carrier 1 is preferably trapazoidal, so that upon immersion of the connections 2b of a component 2 into a solder bath 7, after having tilted the tiltable or pivotal arm 3, there are obtained optimum conditions as concerns the immersion depth of the connections. This has been indicated in FIG. 3, where at the right-hand side thereof there is shown a component 2 in the horizontal starting position and at the left-hand side the component 2 in its tilted or pivoted position. The horizontal line schematically indicates the surface 7a of the solder bath 7. From the showing of this Figure it will be recognized that the immersion depth of the component connections 2b, in the tilted position, is increased in relation to the vertical immersion, without there arising any appreciable increase of the thermal load of the component 2, since there is still provided adequate spacing between the component base surface and the top surface or meniscus 7a of the solder bath 7. The immersion depth of the connections 2b can be very simply determined by appropriate selection of the spacing of the solder bath from the carrier or support 1 and/or the deflection angle of the pivotal fork 10. In order to fixedly retain the component 2, during the rotation of the rotatable table 4, upon the support or carrier 1 the latter is provided at both of its lengthwise sides with suitable recesses, merely schematically indicated by reference character 1a, into which protrude the connections 2b of the component 2, so that there is prevented any displacement thereof in the lengthwise direction upon the support or carrier 1.

The mode of operation of the described apparatus will now be considered and is as follows:

In a not particularly illustrated position of the rotatable table 4 a component 2, infed from a suitable supply magazine or the like, arrives at the support or carrier 1. After the connections 2b of the component 2 have been imbued with a liquid, then during the course of a cycled operation of the system the tiltable arm 3 arrives at the position shown in FIG. 1, so that the component 2 which is to be tin-plated is located over the solder level 7a of the solder bath 7 and is fixedly retained by the bracket 17 or the like upon the carrier or support 1. Now the entrainment member 11 is shifted in one direction by actuating the cylinder 20, resulting in deflection or displacement of the pivotal fork 10 about an angle governed by the adjustment element 15. By means of the entrainment pins 9 the tiltable arm 3 and thus also the component 2 carries out a tilting or pivotal movement. Thereafter the solder bath 7 is raised to a defined height with respect to the position of the support or carrier 1. As a result, the lower situated connection row of the component 2 which has been tilted about an axis in its lengthwise direction extending essentially parallel to the connection row, is immersed into the solder bath 7. After a predetermined soldering time the entrainment member 11 is shifted in the other direction, and consequently, the tiltable arm 3 is tilted or pivoted to the other side about the same angle. In FIG. 2 there have been indicated in phantom or broken lines two possible positions of the pivotal fork member 10. Upon transition of the tiltable or pivotal arm 3 from one position into the other position the one row of connections 2b of the component 2 is withdrawn out of the solder bath 7 and the other connection row is immersed into the solder bath 7. After expiration of the determined soldering time the support or carrier 1, by appropriately displacing the entrainment member 11, again arrives into the horizontal starting position and the solder bath 7 is again lowered. Thereafter, the rotatable table 4 is further turned through a certain angle, so that the next tiltable arm 3 is engaged by the entrainment pin 9 and thus a further component 2 is tin-plated in the described manner. A plurality of tiltable arms 3, each provided with an exchangeable support or carrier 1, can be arranged in a star-like configuration at the rotatable table 4. The conventional removal of the slag which forms as a result of oxidation upon the surface of the solder bath can be accomplished with standard means known to the art for this purpose, for instance at a point in time directly prior to the raising of the solder bath 7. In a not particularly shown position of the rotatable table 4 the pre-tin plated connections 2b of the component 2 are then freed of liquid residues and the component 2 finally is infed to a standard collecting container or receptacle.

With the described apparatus it is basically possible to tin-plate all conventional types of IC-components in dual-in-line housings. Depending upon the type there is only necessary a suitably constructed support or carrier 1. In this case the carrier or support 1 can be exchangeably connected by means of any simple clamping device with the tiltable or pivotal arm 3 and therefore can be easily replaced when the need arises.

While these are shown and described present preferred embodiments of the invention, it is to be distinctly understood that the invention is not limited thereto, but may be otherwise variously embodied and practiced within the scope of the following claims. ACCORDINGLY,

What we claim is:

1. An apparatus for applying to the connections of integrated components arranged in dual-in-line housings solder located in a solder bath, comprising:

at least one support for carrying at least one of the components;

means for displacing said support relative to the solder bath such that the component is placed in a position in which its connections are located at a predetermined distance above the surface of the solder bath;

means for tilting the support in such position about an axis extending essentially parallel to the connections of the component carried by the support and into a position which is inclined with respect to the surface of the solder bath; and the connections of a connection row of the component, following tilting of the support to one or the other side, simultaneously immersing into the solder bath.

2. The apparatus as defined in claim 1, further including:

a plurality of tiltable arms each carrying an exchangeable support;

a rotatable table;

said tiltable arms being arranged in a substantially star-shaped configuration at said rotatable table; and said rotatable table during rotation thereof bringing the supports in succession into a position located over the solder bath.

3. The apparatus as defined in claim 2, further including:

a rotational shaft defining an axis of rotation;

a pivotable fork member rotatable about said axis of rotation;

coupling means for coupling the tiltable arms with said pivotable fork member;

each of said tiltable arms being located in a position where the related support is located over the solder bath when the tiltable arm is coupled by the coupling means with said pivotable fork member.

4. The apparatus as defined in claim 3, further including:

a piston-and-cylinder unit;

said piston-and-cylinder unit having a piston rod provided for said piston;

entrainment means movably connected with said pivotal fork member;

the deflection of the pivotal fork member being accomplished by means of said movably connected entrainment means;

rail means; and said pivotal fork member carrying out a substantially linear movement along said rail means upon actuation of said piston-and-cylinder unit.

5. The apparatus as defined in claim 4, wherein:

said entrainment means can be displaced through a maximum displacement path which is adjustable in order to thereby regulate the inclination of the support with respect to the surface of the solder bath.

6. The apparatus as defined in claim 1, wherein:

said support is provided with recess means for receiving the connections of the component carried thereby; and a holder element for pressing the component against the support as long as the support is located over the solder bath.

* * * * *